United States Patent

Tanikawa

(10) Patent No.: US 12,230,483 B2
(45) Date of Patent: Feb. 18, 2025

(54) DEPOSITION METHOD AND PROCESSING APPARATUS

(71) Applicant: Tokyo Electron Limited, Tokyo (JP)

(72) Inventor: Takehiro Tanikawa, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 68 days.

(21) Appl. No.: 18/178,801

(22) Filed: Mar. 6, 2023

(65) Prior Publication Data

US 2023/0282457 A1 Sep. 7, 2023

(30) Foreign Application Priority Data

Mar. 7, 2022 (JP) .................................. 2022-034486

(51) Int. Cl.
*H01J 37/32* (2006.01)
(52) U.S. Cl.
CPC .. *H01J 37/32715* (2013.01); *H01J 37/32568* (2013.01); *H01J 2237/2007* (2013.01); *H01J 2237/334* (2013.01)
(58) Field of Classification Search
CPC ........... H01J 37/32715; H01J 37/32568; H01J 2237/2007; H01J 2237/334; H01J 37/32091; H01L 21/6831; H01L 21/6833; B23Q 3/15; H02N 13/00
USPC ...................................................... 361/234
See application file for complete search history.

(56) References Cited

U.S. PATENT DOCUMENTS

| 8,896,210 | B2 * | 11/2014 | Nishino | H01J 37/32477 |
| | | | | 315/111.21 |
| 11,011,347 | B2 * | 5/2021 | Hayashi | H01L 21/67103 |
| 12,057,339 | B2 * | 8/2024 | Li | H01J 37/32724 |
| 2018/0202046 | A1 * | 7/2018 | Savas | C23C 16/345 |
| 2019/0148155 | A1 * | 5/2019 | Kubota | H01J 37/32715 |
| | | | | 438/711 |
| 2023/0326779 | A1 * | 10/2023 | Jung | H01L 21/67103 |
| | | | | 361/234 |

FOREIGN PATENT DOCUMENTS

| CN | 116844934 A | * 10/2023 | ........ H01J 37/32082 |
| JP | H04-206754 | 7/1992 | |
| JP | 2003-007810 | 1/2003 | |
| JP | 2003-332412 | 11/2003 | |
| JP | 2005-116686 | 4/2005 | |
| JP | 2013-084935 | 5/2013 | |
| JP | 2018-206804 | 12/2018 | |
| JP | 2022-501840 | 1/2022 | |

\* cited by examiner

*Primary Examiner* — Dharti H Patel
(74) *Attorney, Agent, or Firm* — IPUSA, PLLC

(57) ABSTRACT

A stage includes a base and an electrostatic chuck provided on the base and including N electrodes in the electrostatic chuck, where N is an integer greater than or equal to two. The stage a power supply configured to apply voltages of different N-phases to the respective N electrodes. Each of the voltages has a positive level and a negative level that periodically alternate. A center line of an electrode gap provided between adjacent electrodes is represented by $x=x=r\cdot\cos(\theta+2\pi(n-1)/N)$ and $y=r\cdot\sin(\theta+2\pi(n-1)/N)$.

9 Claims, 9 Drawing Sheets

DEPOSITION METHOD AND PROCESSING APPARATUS

CROSS-REFERENCE TO RELATED APPLICATIONS

This application claims priority to Japanese Patent Application No. 2022-034486, filed on Mar. 7, 2022, the entire contents of which are incorporated herein by reference.

TECHNICAL FIELD

The present disclosure relates to a stage and a substrate processing apparatus.

BACKGROUND

There is a known stage for attracting a substrate in a processing apparatus that performs desired processing, such as etching, on the substrate.

Patent Document 1 discloses an electrostatic chuck apparatus for applying an n (n is 2 or more)-phase AC voltage, wherein the electrostatic chuck apparatus includes electrodes for applying the n-phase AC voltage, a sample support made of an insulator that insulates between respective electrodes, and a circuit for applying the n-phase AC voltage.

RELATED-ART DOCUMENTS

Patent Documents

Patent Document 1: Japanese Unexamined Patent Publication No. 2003-332412

SUMMARY

A stage includes a base and an electrostatic chuck provided on the base and including N electrodes therein which are two or more electrodes. The stage includes a power supply configured to apply, to the N electrodes, voltages of N phases of two or more phases that are different from each other. Each of the voltages has a positive level and a negative level that periodically alternate. A center line of an electrode gap provided between adjacent electrodes is represented by $x = r \cos(\theta + 2\pi(n-1)/N)$ and $y = r \sin(\theta + 2\pi(n-1)/N)$.

DETAILED DESCRIPTION

Figure 1:
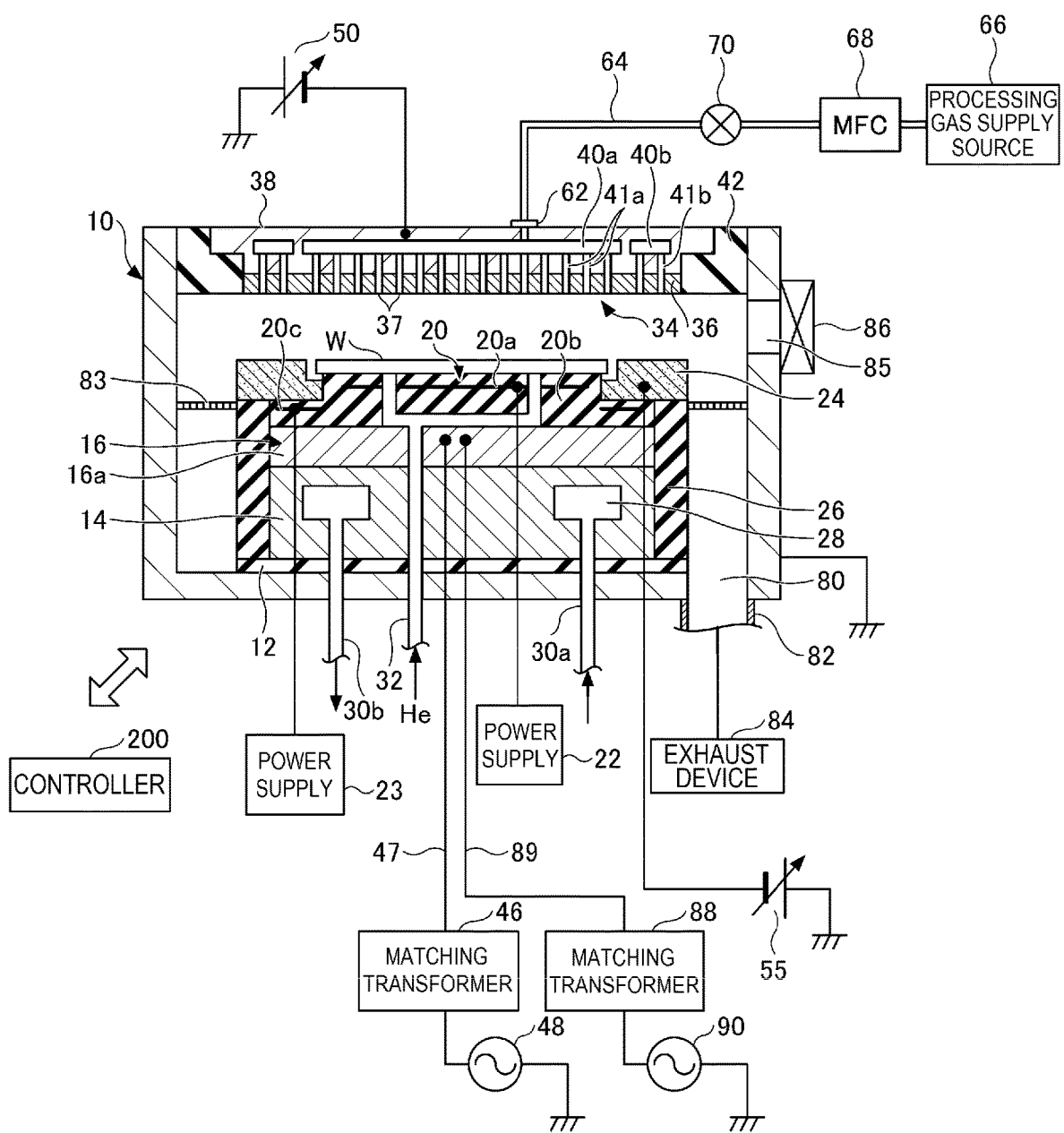
FIG. 1 is a schematic cross-sectional view illustrating an example of a plasma processing apparatus according to an embodiment.

Hereinafter, embodiments for implementing the present disclosure will be described with reference to the drawings. In the respective drawings, the same components will be denoted by the same reference numerals, and overlapping descriptions thereof may be appropriately omitted.

[Plasma Processing Apparatus]

A plasma processing apparatus 1 according to an embodiment will be described with reference to FIG. 1. FIG. 1 is a schematic cross-sectional view illustrating an example of the plasma processing apparatus 1 according to the embodiment. The plasma processing apparatus 1 according to the embodiment is a capacitive-coupled parallel plate processing apparatus and includes a chamber 10. The chamber 10 is, for example, a cylindrical chamber made of aluminum of which surface is anodized, and is grounded.

A columnar support 14 is disposed at a bottom of the chamber 10 through an insulating plate 12 made of ceramic or the like, and for example, a stage 16 is provided on the support 14. The stage 16 includes an electrostatic chuck 20 and a base 16a, and a wafer W is mounted on an upper surface of the electrostatic chuck 20. An annular edge ring 24 made of, for example, silicon is disposed around the wafer W. The edge ring 24 is also called a focus ring. The edge ring 24 is an example of an outer peripheral member disposed around the stage 16. An annular insulator ring 26 made of, for example, quartz is provided around the base 16a and the support 14. A first electrode 20a made of a conductive film is interposed in an insulating layer 20b in a central portion of the electrostatic chuck 20. The first electrode 20a is connected to a power supply 22. A potential difference is generated between a surface of the electrostatic chuck 20 and the wafer W that is an adsorbate by a voltage applied from the power supply 22 to the first electrode 20a, and the wafer W that is an adsorbate is adsorbed onto a wafer mounting surface of the electrostatic chuck 20. Further, inside an outer periphery side of the electrostatic chuck 20, a second electrode 20c made of a conductive film is interposed in the insulating layer 20b. The second electrode 20c is connected to a power supply 23. A potential difference is generated between the surface of the electrostatic chuck 20 and the edge ring 24 that is an adsorbate by a voltage applied from the power supply 23 to the second electrode 20c, and the edge ring 24 that is an adsorbate is adsorbed to an edge ring mounting surface of the electrostatic chuck 20. The electrostatic chuck 20 may have a heater to control a temperature.

For example, a ring-shaped or spiral coolant chamber 28 is formed inside the support 14. A coolant, for example, cooling water, at a predetermined temperature supplied from a chiller unit (not illustrated) is returned to a chiller unit through a pipe 30a, the coolant chamber 28, and a pipe 30b.

By circulating the coolant through a path, a temperature of the wafer W can be controlled by a temperature of the coolant. Furthermore, a heat transfer gas, for example, a He gas supplied from a heat transfer gas supply mechanism (not illustrated) is supplied to a gap between a front surface of the electrostatic chuck 20 and a rear surface of the wafer W through a gas supply line 32. The heat transfer gas increases a heat transfer coefficient between the front surface of the electrostatic chuck 20 and the rear surface of the wafer W, and thus, it is more effective to control the temperature of the wafer W by the temperature of the coolant. Further, when the electrostatic chuck 20 includes a heater, the temperature of the wafer W can be controlled with high responsiveness and high accuracy by heating by the heater and cooling by the coolant. Further, a heat transfer gas, for example, a He gas supplied from a heat transfer gas supply mechanism (not illustrated) may be supplied to the gap between the front surface of the electrostatic chuck 20 and the rear surface of the edge ring 24 through a gas supply line (not illustrated). Further, by controlling pressure of the He gas supplied to the gap between the front surface of the electrostatic chuck 20 and the rear surface of an adsorbate (the wafer W and the edge ring 24), heat transfer characteristics between the electrostatic chuck 20 and the adsorbate (the wafer W and the edge ring 24) may be controlled and a temperature of the adsorbate (the wafer W and the edge ring 24) may be controlled.

An upper electrode 34 is provided in a ceiling portion of the chamber 10 to face the stage 16. A space between the upper electrode 34 and the stage 16 serves as a plasma processing space. The upper electrode 34 closes an opening of the ceiling portion of the chamber 10 through an insulating shielding member 42. The upper electrode 34 includes an electrode plate 36 and an electrode support 38. The electrode plate 36 includes a plurality of gas ejection holes 37 formed on a surface facing the stage 16 and is formed of a silicon-containing material, such as silicon or SiC. The electrode support 38 supports the electrode plate 36 in a detachable manner and is formed of a conductive material, such as aluminum having an anodized surface. Inside the electrode support 38, a plurality of gas flow holes 41a and 41b extend downward from gas diffusion chambers 40a and 40b and communicate with the gas ejection holes 37.

A gas inlet 62 is connected to a processing gas supply source 66 through a gas supply pipe 64. The gas supply pipe 64 is provided with a mass flow controller (MFC) 68 and an opening/closing valve 70 sequentially provided from an upstream side where the processing gas supply source 66 is disposed. The processing gas is supplied from the processing gas supply source 66, a flow rate and opening and closing of the processing gas are controlled by the mass flow controller 68 and the opening/closing valve 70, and through the gas supply pipe 64, the gas diffusion chambers 40a and 40b and the gas flow holes 41a and 41b, the processing gas is ejected from the gas ejection holes 37 in a shower shape.

The plasma processing apparatus 1 includes a first high frequency power supply 90 and a second high frequency power supply 48. The first high frequency power supply 90 generates a first high frequency power (hereinafter, also referred to as an "HF power"). The first high frequency power has a frequency suitable for generating plasma. The frequency of the first high frequency power is, for example, a frequency ranging from 27 MHz to 100 MHz. The first high frequency power supply 90 is connected to the base 16a through a matching transformer 88 and a power supply line 89. The matching transformer 88 includes a circuit for matching output impedance of the first high frequency power supply 90 to impedance of a load (the base 16a). The first high frequency power supply 90 may be connected to the upper electrode 34 through the matching transformer 88.

The second high frequency power supply 48 generates a second high frequency power (hereinafter, also referred to as an "LF power"). The second high frequency power has a frequency lower than the frequency of the first high frequency power. When the second high frequency power is used together with the first high frequency power, the second high frequency power is used as a bias high frequency power for pulling ions into the wafer W. A frequency of the second high frequency power is in the range of, for example, 400 kHz to 13.56 MHz. The second high frequency power supply 48 is connected to the base 16a through a matching transformer 46 and a power supply line 47. The matching transformer 46 includes a circuit for matching output impedance of the second high frequency power supply 48 to impedance of a load (the base 16a). A DC pulse may be used as a bias power for pulling ions into the wafer W. In this case, the plasma processing apparatus 1 includes a DC pulse power supply (not illustrated) instead of the second high frequency power supply 48. The DC pulse power supply is connected to the base 16a through the power supply line 47. Further, a composite wave obtained by combining a plurality of input voltages, such as DC pulses (rectangular waves) and triangular waves, may be used as a bias power for pulling ions into the wafer W. In this case, the plasma processing apparatus 1 includes a power supply (not illustrated) that outputs a composite wave instead of the second high frequency power supply 48. The power supply that outputs the composite wave is connected to the base 16a through the power supply line 47.

Plasma may be generated by using the second high frequency power, that is, by using only a single high frequency power without using the first high frequency power. In this case, a frequency of the second high frequency power may be greater than 13.56 MHz, for example, 40 MHz. The plasma processing apparatus 1 may not include the first high frequency power supply 90 and the matching transformer 88. With this configuration, the stage 16 also functions as a lower electrode. Further, the upper electrode 34 also functions as a shower head that supplies gases.

A second variable power supply 50 is connected to the upper electrode 34 and applies a DC voltage to the upper electrode 34. A first variable power supply 55 is connected to the edge ring 24 and applies a DC voltage to the edge ring 24. By applying a predetermined DC voltage corresponding to the amount of consumption of the edge ring 24 from the first variable power supply 55 to the edge ring 24, a thickness of a sheath on the edge ring 24 is controlled. Thereby, a step difference between the sheath on the edge ring 24 and a sheath on the wafer W is removed, and irradiation angles of ions are prevented from being inclined at an edge portion of the wafer W, and occurrence of tilting in which a shape of a recess formed on the wafer W is inclined is avoided.

An exhaust device 84 is connected to an exhaust pipe 82. The exhaust device 84 includes a vacuum pump, such as a turbo molecular pump, and performs exhaust through the exhaust pipe 82 from an outlet 80 formed at a bottom of the chamber 10 to reduce pressure in the chamber 10 to a desired vacuum level. Further, the exhaust device 84 controls the pressure in the chamber 10 to be constant by using a value of a pressure gauge (not illustrated) that measures the pressure in the chamber 10. An opening 85 is provided in a side wall of the chamber 10. The wafer W is carried into and out of the opening 85 by opening and closing a gate valve 86.

A baffle plate 83 is provided in an annular shape between the insulator ring 26 and a side wall of the chamber 10. The baffle plate 83 has a plurality of through-holes and is made of aluminum, and a surface of the baffle plate 83 is covered with ceramic, such as Y2O3.

When predetermined plasma processing, such as plasma etching, is performed by the plasma processing apparatus 1 having this configuration, the gate valve 86 is opened, the wafer W is carried into the chamber 10 through the opening 85, the wafer W is mounted on the wafer mounting surface of the electrostatic chuck 20, and the gate valve 86 is closed. Further, the edge ring 24 is mounted on the edge ring mounting surface of the electrostatic chuck 20. A processing gas is supplied into the chamber 10, and the inside of the chamber 10 is exhausted by the exhaust device 84.

The first high frequency power and the second high frequency power are applied to the stage 16. Then, the power supply 22 applies a voltage to the first electrode 20a of the electrostatic chuck 20 to adsorb the wafer W to the wafer mounting surface of the electrostatic chuck 20. Further, the power supply 23 applies a voltage to the second electrode 20c of the electrostatic chuck 20 to adsorb the edge ring 24 to the edge ring mounting surface of the electrostatic chuck 20. A DC voltage may be applied from the second variable power supply 50 to the upper electrode 34.

Plasma processing, such as etching, is performed on a surface to be processed of the wafer W by radicals or ions in plasma generated in a plasma processing space.

The plasma processing apparatus 1 includes a controller 200 that controls the entire operation of the plasma processing apparatus. A CPU provided in the controller 200 performs desired plasma processing, such as etching, according to a recipe stored in a memory, such as a ROM or a RAM. Process time, pressure (exhaust of gas), the first high frequency power, the second high frequency power, a voltage, and various gas flow rates, which are included in control information of the apparatus for process conditions, may be set in the recipe. Further, an internal temperature (an upper electrode temperature, a sidewall temperature of the chamber, the temperature of the wafer W, an electrostatic chuck temperature, or the like) of a chamber, the temperature of the coolant output from the chiller, and the like may be set in the recipe. A recipe indicating these programs and processing conditions may be stored in a hard disk or a semiconductor memory. Further, the recipe may be set to a predetermined position in a state where the recipe is accommodated in a portable storage medium readable by a computer, such as a CD-ROM or a DVD, and may be read therefrom.

Figure 2:
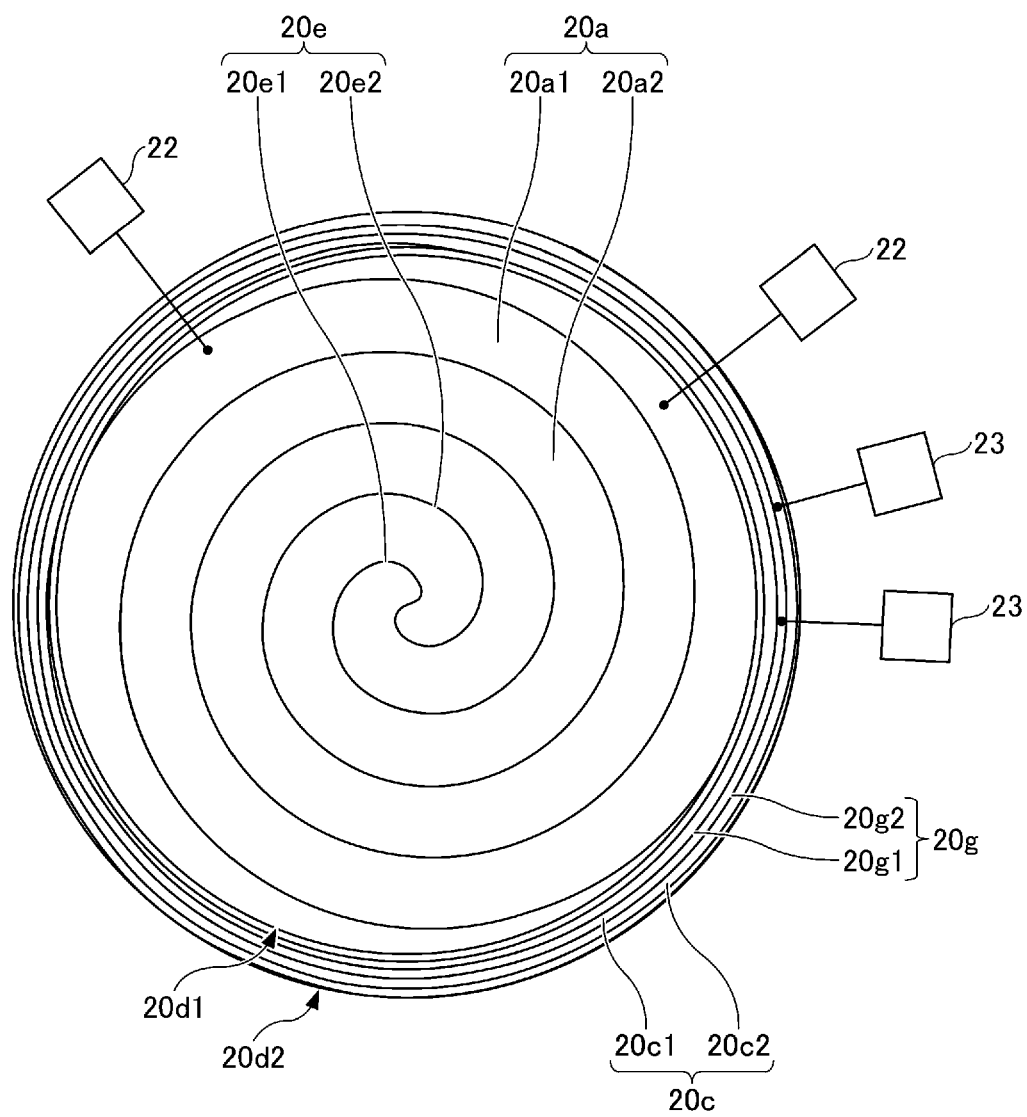
FIG. 2 is a plan view illustrating an example of arrangement of electrodes of an electrostatic chuck.
Figure 3:
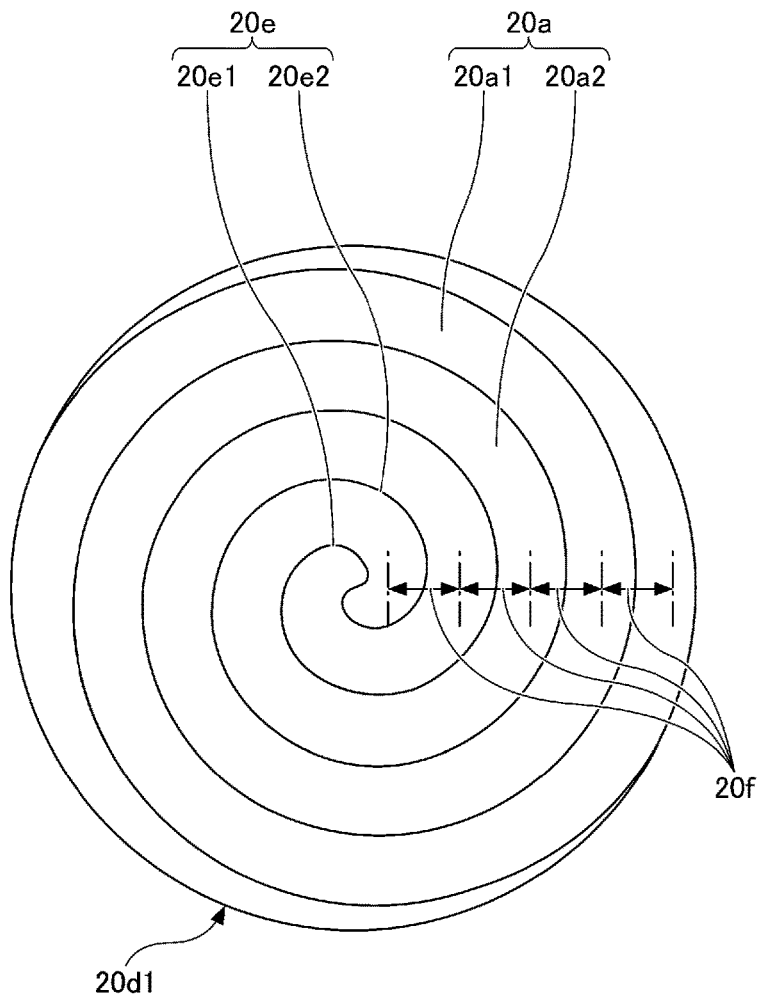
FIG. 3 is a plan view illustrating an example of the arrangement of a first electrode on a wafer mounting surface of the electrostatic chuck.
Figure 4:
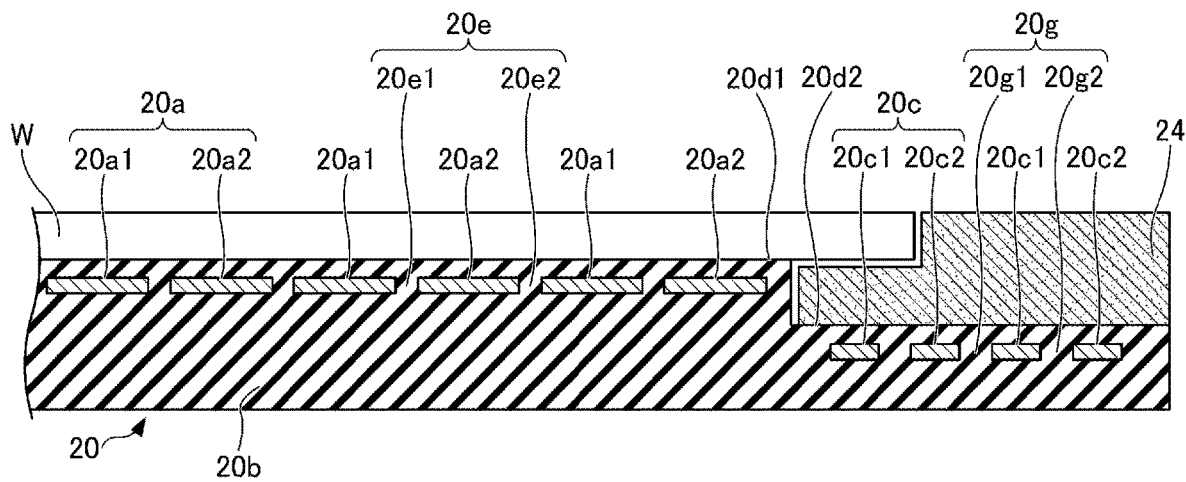
FIG. 4 is a cross-sectional view illustrating an example of the arrangement of the electrodes of the electrostatic chuck.

Next, arrangement of the electrodes 20a and 20c of the electrostatic chuck 20 on the stage 16 will be further described with reference to FIGS. 2 to 4. FIG. 2 is a plan view illustrating an example of the arrangement of the electrodes 20a and 20c of the electrostatic chuck 20. FIG. 3 is a plan view illustrating an example of the arrangement of the first electrode 20a on a wafer mounting surface 20d1 of the electrostatic chuck 20. FIG. 4 is a cross-sectional view illustrating an example of the arrangement of the electrodes 20a and 20c of the electrostatic chuck 20. The electrostatic chuck 20 includes the wafer mounting surface 20d1 on which the wafer W is mounted, and an edge ring mounting surface 20d2 on which the edge ring 24 is mounted.

As illustrated in FIGS. 2 to 4, the first electrode 20a on the wafer mounting surface 20d1 includes N electrodes which are two or more electrodes. In the examples of the electrostatic chuck 20 illustrated in FIGS. 2 to 4, the first electrode 20a is a bipolar electrode and includes electrodes 20a1 and 20a2.

The electrode 20a1 is spirally disposed around a central axis of the electrostatic chuck 20. In other words, the electrode 20a1 is formed from a central side of the wafer mounting surface 20d1 to an outer periphery side and is formed in a spiral shape such that a rotation radius increases as a rotation angle increases. That is, the electrode 20a1 is disposed over the entire periphery of the electrostatic chuck 20 in a peripheral direction around the central axis of the electrostatic chuck 20 and is disposed from a central portion of the wafer mounting surface 20d1 to a peripheral edge portion (an outer peripheral portion). The electrode 20a2 is also disposed in a spiral shape in the same manner.

An area ratio between the electrodes 20a1 and 20a2 is 1. That is, the electrodes 20a1 and 20a2 are formed to have the same area.

Further, the electrodes 20a1 and 20a2 are coaxially disposed with respect to the central axis of the electrostatic chuck 20 and are disposed symmetrically in a rotation direction. That is, the first electrode 20a composed of two electrodes has a rotational symmetry of 180 degrees. The rotated electrode 20a1 coincides with the electrode 20a2 when the electrode 20a1 rotates by 180 degrees in a case where the central axis of the electrostatic chuck 20 is a rotation axis.

Further, as illustrated in FIG. 4, the electrode 20a2 is disposed inwardly adjacent to the electrode 20a1 in a radial direction, and the electrode 20a2 is disposed outwardly adjacent to the electrode 20a1 in the radial direction. The electrode 20a1 is disposed inwardly adjacent to the electrode 20a2 in the radial direction, and the electrode 20a1 is disposed outwardly adjacent to the electrode 20a2 in the radial direction.

The power supply 22 is connected to each of the electrodes 20a1 and 20a2. The power supply 22 applies an N-phase AC voltage of two or more different phases to the first electrode 20a that includes N electrodes, i.e., two or more electrodes. In the example of the electrostatic chuck 20 illustrated in FIG. 2, the power supply 22 applies AC voltages of two different phases to the two electrodes 20a1 and 20a2, respectively.

An electrode gap 20e (20e1 and 20e2) is formed as a part of the insulating layer 20b that is between the electrodes 20a1 and 20a2 next to each other. A center line of the electrode gap 20e is defined by following Equation (1) and Equation (2), and the electrode gap 20e is formed as an insulator. The insulator has predetermined widths that are respective distances from the two sides of the insulator from the center line of the electrode gap 20e, in a plan view.

$$x = r\,\text{Cos}(\theta + 2\pi(n-1)/N) \quad (1)$$

$$y = r\,\text{Sin}(\theta + 2\pi(n-1)/N) \quad (2)$$

Where, N represents the number of electrodes, and n represents a parameter that denotes a range of 1 to N (n=1, 2 in the example of FIG. 3). The x and y represent coordinates in an orthogonal coordinate system in which the center of the electrostatic chuck 20 is an original point. The $\theta$ represents a rotation angle of a polar coordinate system in which the center of the electrostatic chuck 20 is the original point. The r represents a diameter of a polar coordinate system in which the center of the electrostatic chuck 20 is the original point. The relationship between r and $\theta$ is defined by Equation (3) below. Where, A is a constant.

$$r = A\theta \quad (3)$$

In FIG. 3, the electrode gap 20e includes the electrode gap 20e1 and the electrode gap 20e2 that extend from the center of the electrostatic chuck 20. Each of the electrode gap 20e1 and the electrode gap 20e2 defines a spiral shape. A center line of the electrode gap 20e1 is represented by Equation (1) and Equation (2) above, if n=1 is given. A center line of the electrode gap 20e2 is represented by Equation (1) and Equation (2) above, if n=2 is given.

Further, the electrode gaps 20e1 and 20e2 are coaxially disposed around the central axis of the electrostatic chuck 20, and are disposed symmetrically with respect to a rotation direction. That is, the electrode gap 20e has a rotational symmetry of 180 degrees. When the electrode gap 20e1 is rotated by 180 degrees by using the central axis of the electrostatic chuck 20 as a rotation axis, the electrode gap 20e1 coincides with the electrode gap 20e2.

In other words, the center line of the electrode gap 20e1 is defined by an Archimedean spiral ($r=A\theta$, A is a constant). The center line of the electrode gap 20e2 is defined by rotating, by 180 degrees, the center line of the electrode gap 20e1 defined by the Archimedean spiral with respect to the central axis of the electrostatic chuck 20.

With this arrangement, pitches 20f, which are each distances between center lines of the adjacent electrodes 20a, can be equal to each other. Further, a length occupied by any electrode can be constant regardless of an angle at which a radius is drawn. Further, the total value of attraction forces at any angle is constant at all times, and a rotational symmetry of the attraction forces in a peripheral direction can be reliably ensured.

Further, as illustrated in FIG. 2, the second electrode 20c on the edge ring mounting surface 20d2 includes N electrodes which are two or more electrodes. In the example of the electrostatic chuck 20 illustrated in FIG. 2, the second electrode 20c includes two electrodes of electrodes 20c1 and 20c2.

The electrode 20c1 is spirally disposed around the central axis of the electrostatic chuck 20. In other words, the electrode 20c1 is formed from an inner peripheral portion of the edge ring mounting surface 20d2 to an outer peripheral portion thereof and is formed in a spiral shape such that a rotation radius increases as a rotation angle increases. That is, the electrode 20c1 is disposed over the entire periphery of the electrostatic chuck 20 in a peripheral direction around the central axis of the electrostatic chuck 20 and is disposed from the inner peripheral portion of the edge ring mounting surface 20d2 to the outer peripheral portion thereof. The electrode 20c2 is also disposed in a spiral shape in the same manner.

The electrodes 20c1 and 20c2 have an area ratio of 1. That is, the electrodes 20c1 and 20c2 are formed to have the same area.

Further, the electrodes 20c1 and 20c2 are coaxially disposed with respect to the central axis of the electrostatic chuck 20 and are disposed symmetrically in a rotation direction. That is, the second electrode 20c composed of two electrodes has a rotational symmetry of 180 degrees. The electrode 20c1 coincides with the electrode 20c2 when rotating by 180 degrees by using the central axis of the electrostatic chuck 20 as a rotation axis.

Further, as illustrated in FIG. 4, the electrode 20c2 is disposed adjacent to an inner side of the electrode 20c1 in a radial direction, and the electrode 20c2 is disposed adjacent to an outer side of the electrode 20c1 in the radial direction. The electrode 20c1 is disposed adjacent to an inner side of the electrode 20c2 in the radial direction, and the electrode 20c1 is disposed adjacent to an outer side of the electrode 20c2 in the radial direction.

The power supply 23 is connected to each of the electrodes 20c1 and 20c2. The power supply 23 applies an N-phase AC voltage of two or more phases different from each other to the second electrode 20c including N electrodes of two or more electrodes. In the example of the electrostatic chuck 20 illustrated in FIG. 2, the power supply 23 applies an AC voltage of two phases different from each other to the two electrodes 20c1 and 20c2.

Here, an electrode gap 20g (20g1 and 20g2) is formed as a part of the insulating layer 20b between the electrodes 20c1 and 20c2 adjacent to each other. A center line of the electrode gap 20g is defined by Equation (1) and Equation (2) above, and the electrode gap 20g is formed as an insulator having predetermined widths on both sides from the center line of the electrode gap 20g in a plan view.

Further, the electrode gaps 20g1 and 20g2 are coaxially disposed with respect to the central axis of the electrostatic chuck 20 and are disposed symmetrically in a rotation direction. That is, the electrode gap 20g has a rotational symmetry of 180 degrees. The electrode gap 20g1 coincides with the electrode gap 20g2 when rotating by 180 degrees by using the central axis of the electrostatic chuck 20 as a rotation axis.

In other words, a center line of the electrode gap 20g1 is defined by an Archimedean spiral ($r=A\theta$, A is a constant). A center line of the electrode gap 20g2 is defined by rotating, by 180 degrees, the center line of the electrode gap 20g1 defined by the Archimedean spiral with respect to the central axis of the electrostatic chuck 20.

Thereby, pitches, which are distances between center lines of the adjacent electrodes 20c1 and 20c2, can be equal to each other. Further, a length occupied by any electrode can be constant regardless of an angle at which a radius is drawn. Further, the total value of attraction forces at any angle is constant at all times, and a rotational symmetry of the attraction forces in a peripheral direction can be reliably ensured.

Figure 5:
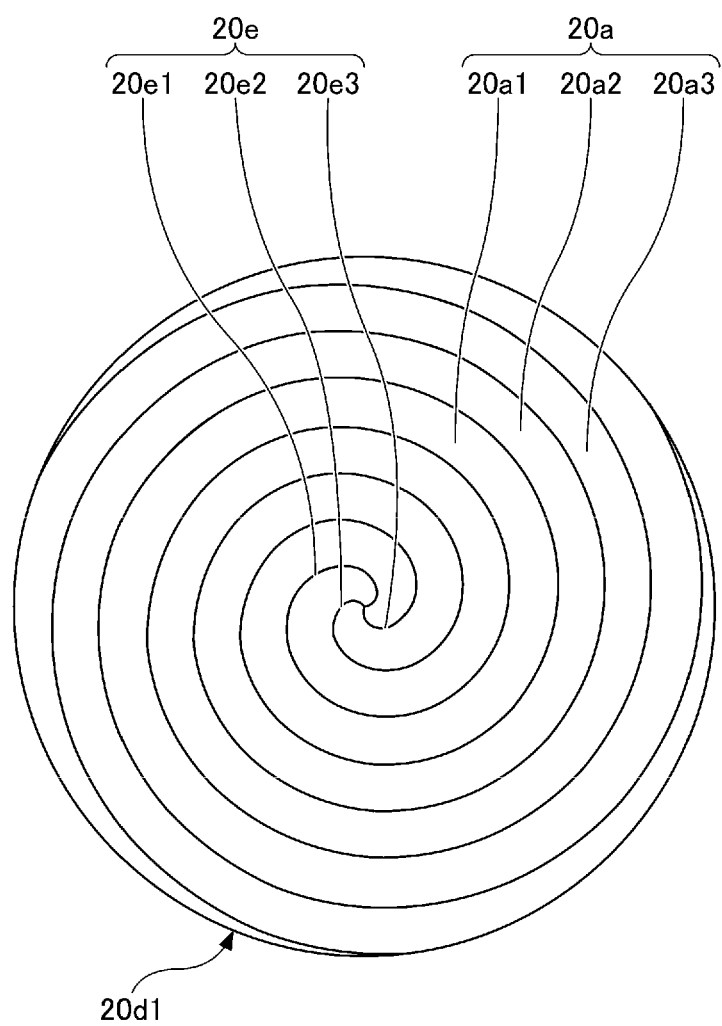
FIG. 5 is a plan view illustrating another example of the arrangement of the first electrode on the wafer mounting surface of the electrostatic chuck.

Although a case where the first electrode 20a includes two electrodes as illustrated in FIGS. 2 to 4 is described as an example, the present disclosure is not limited thereto. FIG. 5 is a plan view illustrating another example of the arrangement of the first electrode 20a on the wafer mounting surface 20d1 of the electrostatic chuck 20. In the example of the electrostatic chuck 20 illustrated in FIG. 5, the first electrode 20a includes three electrodes 20a1, 20a2, and 20a3.

The electrode 20a1 is spirally disposed around a central axis of the electrostatic chuck 20. In other words, the electrode 20a1 is formed from a central side of the wafer mounting surface 20d1 to an outer periphery side and is formed in a spiral shape such that a rotation radius increases as a rotation angle increases. That is, the electrode 20a1 is disposed over the entire periphery of the electrostatic chuck 20 in a peripheral direction around the central axis of the electrostatic chuck 20 and is disposed from a central portion of the wafer mounting surface 20d1 to a peripheral edge portion (an outer peripheral portion). The electrodes 20a2 and 20a3 are also disposed in a spiral shape in the same manner.

The electrodes 20a1, 20a2, and 20a3 have an area ratio of 1. That is, the electrodes 20a1, 20a2, and 20a3 are formed to have the same area.

Further, the electrodes 20a1, 20a2, and 20a3 are coaxially disposed with respect to the central axis of the electrostatic chuck 20 and are disposed symmetrically in a rotation direction. That is, the first electrode 20*a* composed of three electrodes has a rotational symmetry of 120 degrees. The electrode 20*a*1 coincides with the electrode 20*a*2 when rotating by 120 degrees by using the central axis of the electrostatic chuck 20 as a rotation axis. The electrode 20*a*1 coincides with the electrode 20*a*3 when rotating by 240°.

Further, the electrode 20*a*3 is disposed adjacent to an inner side of the electrode 20*a*1 in a radial direction, and the electrode 20*a*2 is disposed adjacent to an outer side of the electrode 20*a*1 in the radial direction. The electrode 20*a*1 is disposed adjacent to an inner side of the electrode 20*a*2 in the radial direction, and the electrode 20*a*3 is disposed adjacent to an outer side of the electrode 20*a*2 in the radial direction. The electrode 20*a*2 is disposed adjacent to an inner side of the electrode 20*a*3 in the radial direction, and the electrode 20*a*1 is disposed adjacent to an outer side of the electrode 20*a*3 in the radial direction.

The power supply 22 is connected to each of the electrodes 20*a*1, 20*a*2, and 20*a*3. The power supply 22 applies an N-phase AC voltage of two or more phases different from each other to the first electrode 20*a* including N electrodes of two or more electrodes. In the example of the electrostatic chuck 20 illustrated in FIG. 5, the power supply 22 applies an AC voltage of three phases different from each other to the three electrodes 20*a*1, 20*a*2, and 20*a*3.

Here, the electrode gap 20*e* is formed as a part of the insulating layer 20*b* between the adjacent electrodes 20*a*1, 20*a*2, and 20*a*3. A center line of the electrode gap 20*e* is defined by the above Equation (1) and Equation (2), and the electrode gap 20*e* is formed as an insulator having predetermined widths on both sides from the center line of the electrode gap 20*e* in a plan view.

In FIG. 5, the electrode gap 20*e* includes electrode gaps 20*e*1, 20*e*2, and 20*e*3 extending in a spiral shape from the center of the electrostatic chuck 20. A center line of the electrode gap 20*e*1 is represented by the above equations when n=1. A center line of the electrode gap 20*e*2 is represented by the above equations when n=2. A center line of the electrode gap 20*e*3 is represented by the above equations when n=3.

Further, the electrode gaps 20*e*1, 20*e*2, and 20*e*3 are coaxially disposed with respect to the central axis of the electrostatic chuck 20 and are disposed symmetrically in a rotation direction. That is, the electrode gap 20*e* has a rotational symmetry of 120 degrees. The electrode gap 20*e*1 coincides with the electrode gap 20*e*2 when rotating by 120 degrees by using the central axis of the electrostatic chuck 20 as a rotation axis. The electrode gap 20*e*1 coincides with the electrode gap 20*e*3 when rotating by 240 degrees by using the central axis of the electrostatic chuck 20 as a rotation axis.

In other words, the center line of the electrode gap 20*e*1 is defined by an Archimedean spiral ($r=A\theta$, A is a constant). The center line of the electrode gap 20*e*2 is defined by rotating, by 120 degrees, the center line of the electrode gap 20*e*1 defined by the Archimedean spiral with respect to the central axis of the electrostatic chuck 20. The center line of the electrode gap 20*e*3 is defined by rotating, by 240 degrees, the center line of the electrode gap 20*e*1 defined by the Archimedean spiral with respect to the central axis of the electrostatic chuck 20.

Thereby, pitches, which are distances between the center lines of the adjacent electrodes 20*a*, can be equal to each other. Further, a length occupied by any electrode can be constant regardless of an angle at which a radius is drawn. Further, the total value of attraction forces at any angle is constant at all times, and a rotational symmetry of the attraction forces in a peripheral direction can be reliably ensured.

Figure 6A:
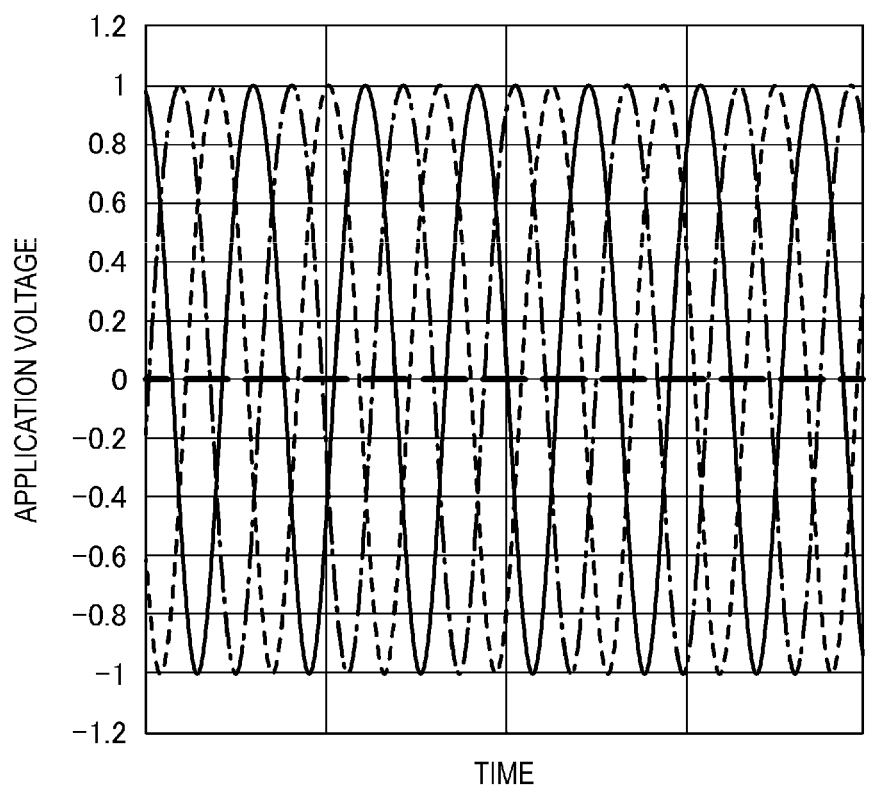
FIG. 6A is a graph illustrating an example of a three-phase AC voltage that is applied to an electrode.

Next, a three-phase AC voltage, which is applied to the first electrode 20*a* including three electrodes (the electrodes 20*a*1, 20*a*2, and 20*a*3) as illustrated in FIG. 5, will be described with reference to FIG. 6A. FIG. 6A is a graph illustrating examples of three-phase AC voltage applied to the electrodes 20*a*1, 20*a*2, and 20*a*3. A vertical axis represents the application voltage, and a horizontal axis represents time. An example of the AC voltage applied to the electrode 20*a*1 is illustrated by a solid line graph, an example of the AC voltage applied to the electrode 20*a*2 is illustrated by an alternate long and short dash line graph, and an example of the AC voltage applied to the electrode 20*a*3 is illustrated by a dash line graph. Amplitudes of the application voltages are normalized as 1.

The AC voltages applied to the electrodes 20*a*1, 20*a*2, and 20*a*3 by the power supply 22 have the same maximum amplitude, the same frequency, and different phases from each other. For example, a phase difference between the AC voltages applied to the electrodes 20*a*1, 20*a*2, and 20*a*3 is set to 120 degrees.

Figure 6B:
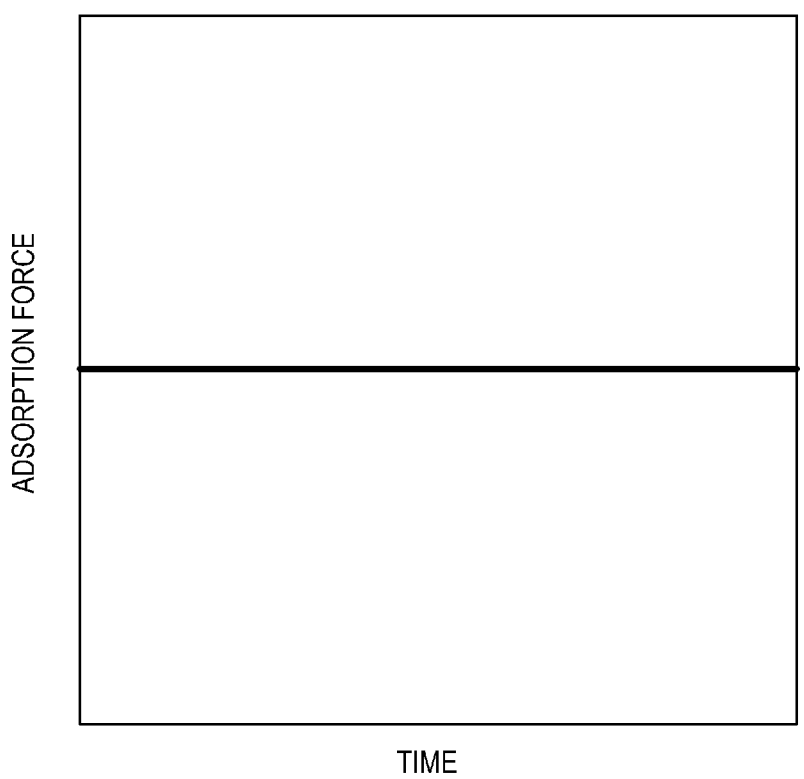
FIG. 6B is a graph illustrating an example of a total sum of attraction forces obtained when the three-phase AC voltage is applied.

The attraction force on the wafer W when the three-phase AC voltages illustrated in FIG. 6A are applied to the first electrode 20*a* (the electrodes 20*a*1, 20*a*2, and 20*a*3) will be described with reference to FIG. 6B. FIG. 6B is a graph illustrating an example of the total sum of attraction forces on the wafer W when the three-phase AC voltage is applied to the electrodes 20*a*1, 20*a*2, and 20*a*3. A vertical axis represents the total sum of the attraction forces, and a horizontal axis represents time. As illustrated in FIG. 6B, the attraction force by which the stage 16 adsorbs the wafer W can be constant.

Figure 7A:
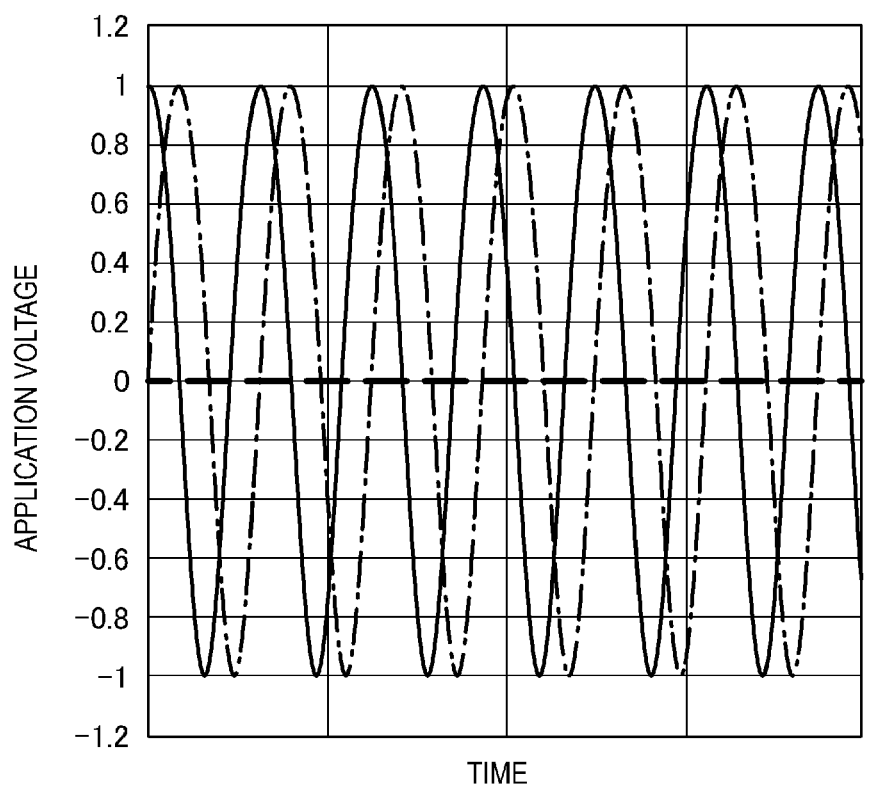
FIG. 7A is a graph illustrating an example of a two-phase AC voltage that is applied to an electrode.

Next, a two-phase AC voltage, which is applied to the first electrode 20*a* including two electrodes (the electrodes 20*a*1 and 20*a*2) as illustrated in FIGS. 2 to 4, will be described with reference to FIG. 7A. FIG. 7A is a graph illustrating an example of a two-phase AC voltage applied to the electrodes 20*a*1 and 20*a*2. A vertical axis represents the application voltage, and a horizontal axis represents time. An example of the AC voltage applied to the electrode 20*a*1 is illustrated by a solid line graph, and an example of the AC voltage applied to the electrode 20*a*2 is illustrated by an alternate long and short dash line graph. Amplitudes of the application voltages are normalized as 1.

The AC voltages applied to the electrodes 20*a*1 and 20*a*2 of the first electrode 20*a* by the power supply 22 have the same maximum amplitude, the same frequency, and different phases from each other. For example, a phase difference between the AC voltages applied to the electrodes 20*a*1 and 20*a*2 is set to 90 degrees.

Figure 7B:
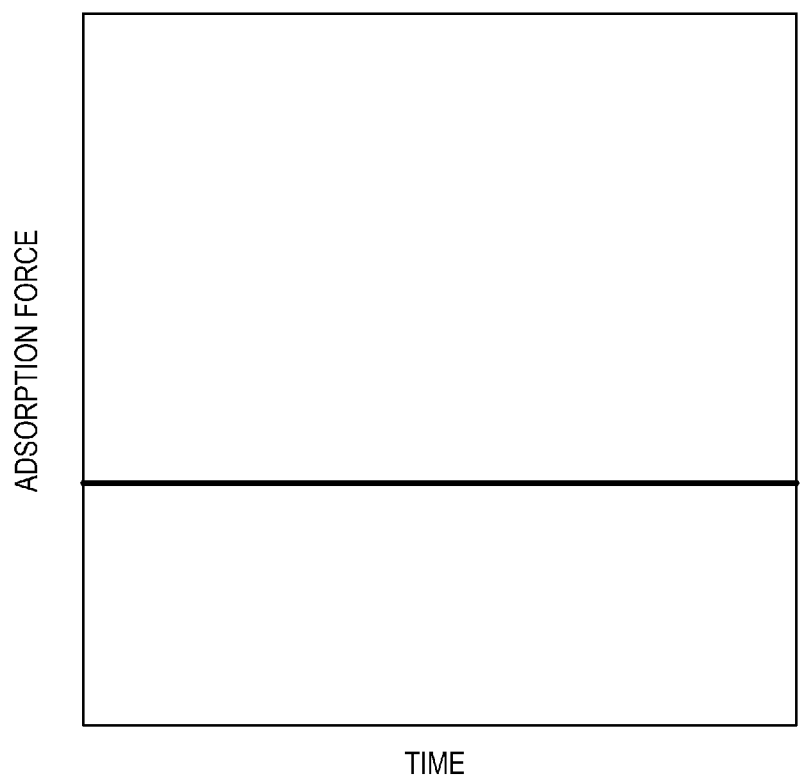
FIG. 7B is a graph illustrating an example of the total sum of attraction forces obtained when the two-phase AC voltage is applied.

The attraction force on the wafer W when the two-phase AC voltage illustrated in FIG. 7A is applied to the first electrode 20*a* (the electrodes 20*a*1 and 20*a*2) will be described with reference to FIG. 7B. FIG. 7B is a graph illustrating an example of the total sum of attraction forces on the wafer W when the two-phase AC voltage is applied to the electrodes 20*a*1 and 20*a*2. A vertical axis represents the total sum of the attraction forces, and a horizontal axis represents time. As illustrated in FIG. 7B, even when the first electrode 20*a* includes two electrodes, the attraction force by which the stage 16 adsorbs the wafer W can be constant.

The same applies to a two-phase AC voltage that is applied to the second electrode 20*c* (the electrodes 20*c*1 and 20*c*2) including two electrodes.

Further, although FIGS. 2 to 4 illustrate that the first electrode 20a includes two electrodes and the second electrode 20c includes two electrodes, the present disclosure is not limited thereto. Further, the number of electrodes of the first electrode 20a and the number of electrodes of the second electrode 20c may each be 2 or more. Further, the number of electrodes of the first electrode 20a and the number of electrodes of the second electrode 20c may be the same as or different from each other.

Here, in the N electrodes, the N-phase AC voltage is represented by following equation (4) in which an amplitude is referred to as B and a cycle is referred to as ω. Here, n is an individual integer corresponding to each of electrodes of N or less.

$$B \sin(\omega t + n/N \times 360°) \quad (4)$$

Further, in one electrode (for example, the electrode 20a2), a phase difference with another electrode (for example, the electrode 20a1) on an inner peripheral side is (1/N×360°), and a phase difference with another electrode (for example, the electrode 20a3) on an outer periphery side is (1/N×360°). Therefore, a potential difference between adjacent electrodes can be reduced. Thereby, electrodes can be prevented from being short-circuited.

In other words, an interval between electrodes can be narrowed, and an area (a width in a radial direction) of the electrodes can be widened. Thereby, a ratio of the wafer mounting surface 20d1 occupied by the first electrode 20a can be increased. Here, the attraction force occurs at a position where electrodes are formed, and the attraction force does not occur in an insulating region between the electrodes. According to the electrostatic chuck 20, the attraction force of the wafer W can be increased by widening an area of an electrode. Further, in-plane uniformity of the attraction force can be improved. Although the first electrode 20a that adsorbs the wafer W is described by way of example, the same applies to the second electrode 20c that adsorbs the edge ring 24.

Further, a configuration, in which the number of electrodes is 6 or more and an AC voltage of six or more phases is used, is preferable. For example, in case of a six-phase AC voltage, a phase difference between adjacent electrodes is 60 degrees, and a potential difference between adjacent electrodes is at most equal to or less than an amplitude A. Thereby, electrodes can be prevented from being short-circuited. Further, by narrowing an interval between electrodes and widening an area (a width in a radial direction) of the electrodes, the attraction force can be increased, and in-plane uniformity of the attraction force can be improved. Further, as the number of electrodes (the number of phases of an AC voltage) increases, these effects can also be improved.

Further, since the first electrode 20a and the second electrode 20c are formed in a spiral shape, irregularity of the attraction force on the wafer W in a peripheral direction due to the electrostatic chuck 20 can be reduced.

Further, although the power supplies 22 and 23 are described as power supplies that apply an AC voltage, the present disclosure is not limited thereto. The power supplies 22 and 23 may each apply an AC voltage having a cycle in which a positive voltage and a negative voltage are periodically switched. In other words, each of the power supplies 22 and 23 may apply an AC voltage that periodically repeats a maximum value and a minimum value of an amplitude. In other words, each of the power supplies 22 and 23 may apply an AC voltage that periodically repeats increase and decrease.

Examples of waveforms of application voltages of a power supply will be described with reference to FIGS. 8A to 8D. FIGS. 8A to 8D are graphs illustrating the examples of the waveforms of the application voltages of the power supply. In FIGS. 8A to 8D, a horizontal axis represents time, and a vertical axis represents the application voltage. Amplitudes of the application voltages are normalized as 1.

Figure 8A:
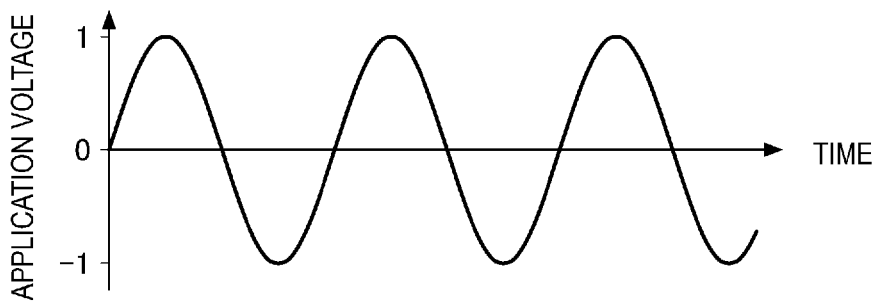
FIGS. 8A to 8D are graphs illustrating examples of voltage waveforms applied by a power supply.

As illustrated in FIG. 8A (in addition, see FIGS. 6A and 7A), the power supplies 22 and 23 may each apply a sinusoidal-wave voltage.

Figure 8B:
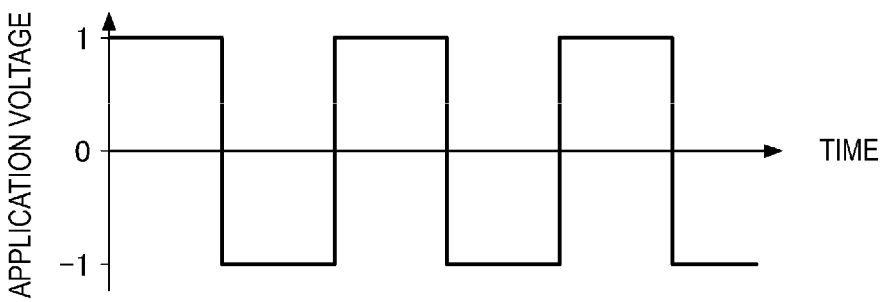

Further, as illustrated in FIG. 8B, the power supplies 22 and 23 may each apply a rectangular-wave voltage. A rectangular-wave application voltage periodically repeats a rapid decrease after a maximum value of the application voltage is maintained for a predetermined time and a rapid increase after a minimum value of the application voltage is maintained for a predetermined time. Thereby, the rectangular-wave application voltage is periodically switched between a positive voltage and a negative voltage.

Figure 8C:
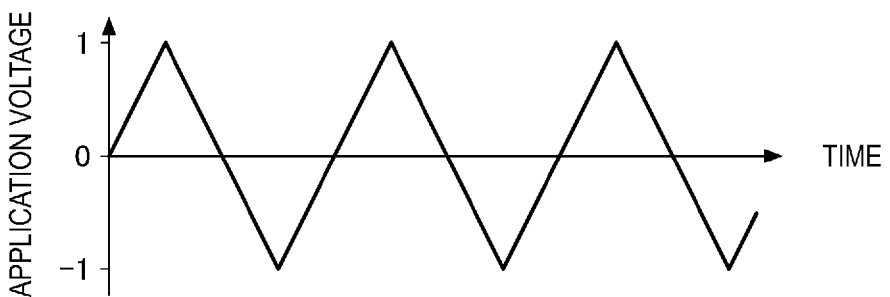

Further, as illustrated in FIG. 8C, the power supplies 22 and 23 may each apply a triangular-wave voltage. The triangular-wave application voltage periodically repeats an increase from a minimum value to a maximum value and a decrease from the maximum value to the minimum value. Thereby, the triangular-wave application voltage is periodically switched between a positive voltage and a negative voltage.

Figure 8D:
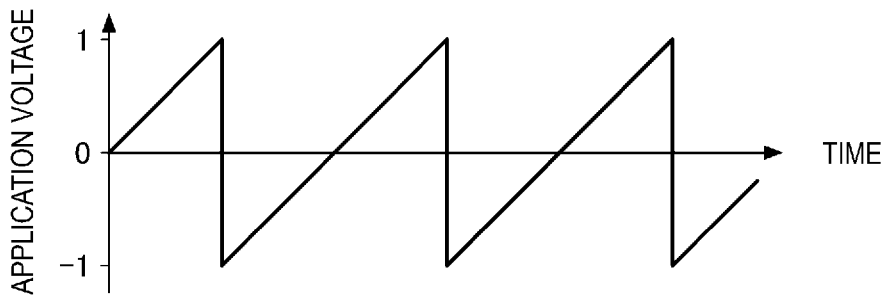

Further, as illustrated in FIG. 8D, the power supplies 22 and 23 may each apply a sawtooth-wave voltage. The sawtooth-wave application voltage periodically repeats a gradual increase from a minimum value to a maximum value and a rapid decrease from the maximum value to the minimum value. Thereby, the sawtooth-wave application voltage is periodically switched between a positive voltage and a negative voltage.

Further, although not illustrated, the power supplies 22 and 23 may each apply a reverse sawtooth-wave voltage. The reverse sawtooth-wave application voltage periodically repeats a rapid increase from a minimum value to a maximum value and a gradual decrease from the maximum value to the minimum value. Thereby, the reverse sawtooth-wave application voltage is periodically switched between a positive voltage and a negative voltage.

Although not illustrated, the power supplies 22 and 23 may each apply a pseudo sinusoidal-wave voltage. The pseudo sinusoidal-wave application voltage periodically repeats a multiple-step decrease after a maximum value of the application voltage is maintained for a predetermined time and a multiple-step increase after a minimum value of the application voltage is maintained for a predetermined time. Thereby, the pseudo sinusoidal-wave application voltage is periodically switched between a positive voltage and a negative voltage.

Further, as illustrated in, for example, FIGS. 6 and 7 and FIGS. 8A to 8D, waveforms of voltages output from the power supplies 22 and 23 preferably have the same positive and negative periods and the same amplitude in the voltage in which positive and negative values are periodically switched.

Figure 9:
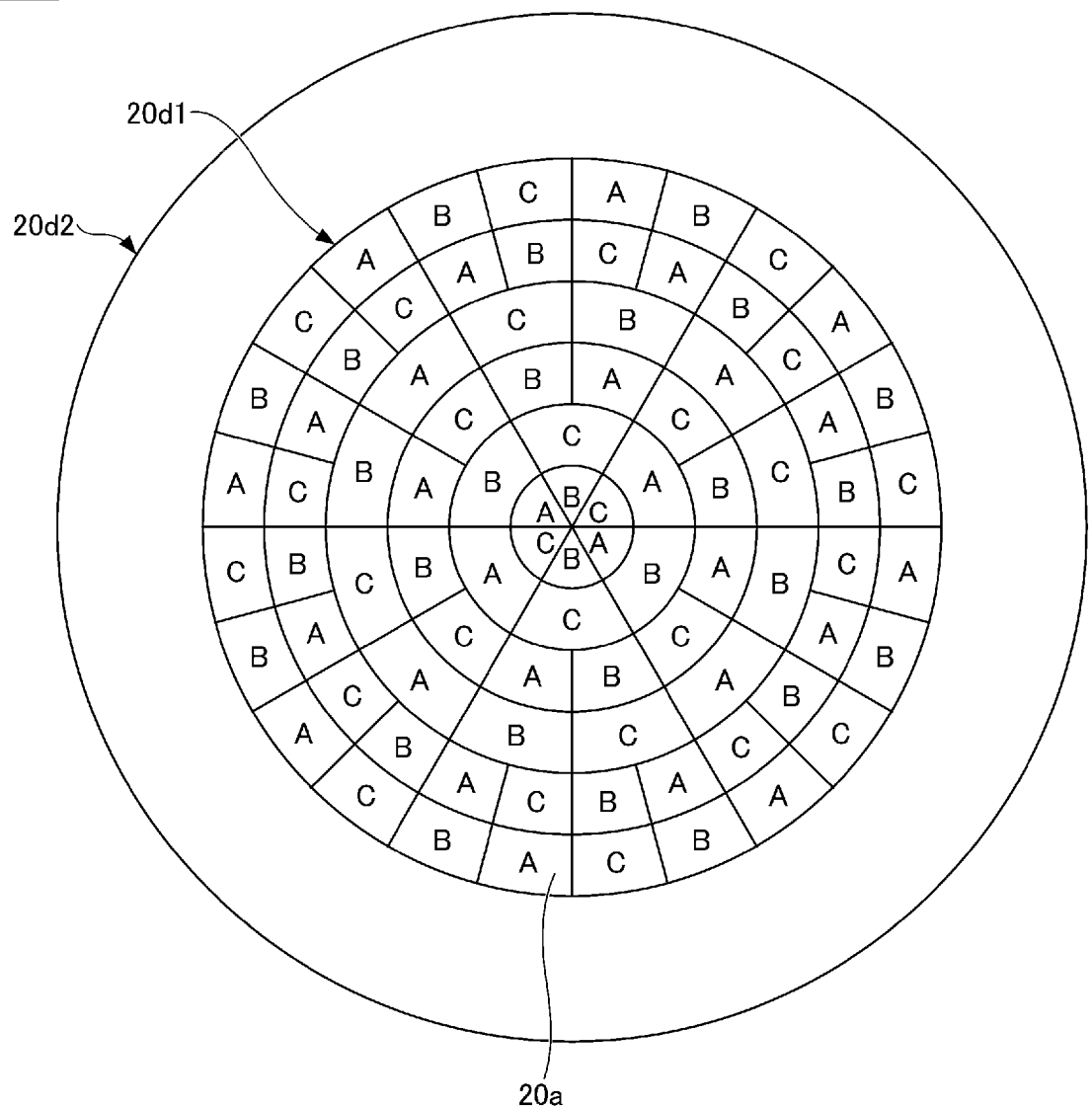
FIG. 9 is a plan view illustrating an example of the arrangement of electrodes of the electrostatic chuck according to a reference example.

Here, the electrostatic chuck 20 according to a reference example will be described with reference to FIGS. 9 and 10. FIG. 9 is a plan view illustrating an arrangement example of an electrode 20X1 of the electrostatic chuck according to the reference example. In the arrangement example of the electrode illustrated in FIG. 9, three electrodes, which are partitioned in a radial direction and a peripheral direction and indicated by A, B, and C, are alternately disposed.

Thereby, the electrodes have symmetry in the peripheral direction. FIG. 10 is an example of a plan view illustrating an arrangement example of an electrode 20X2 of an electrostatic chuck according to another reference example. In the arrangement example of the electrode illustrated in FIG. 10, three electrodes, which are partitioned into hexagons and indicated by A, B, and C, are alternately disposed. Thereby, the electrodes have symmetry in the peripheral direction.

Figure 10:
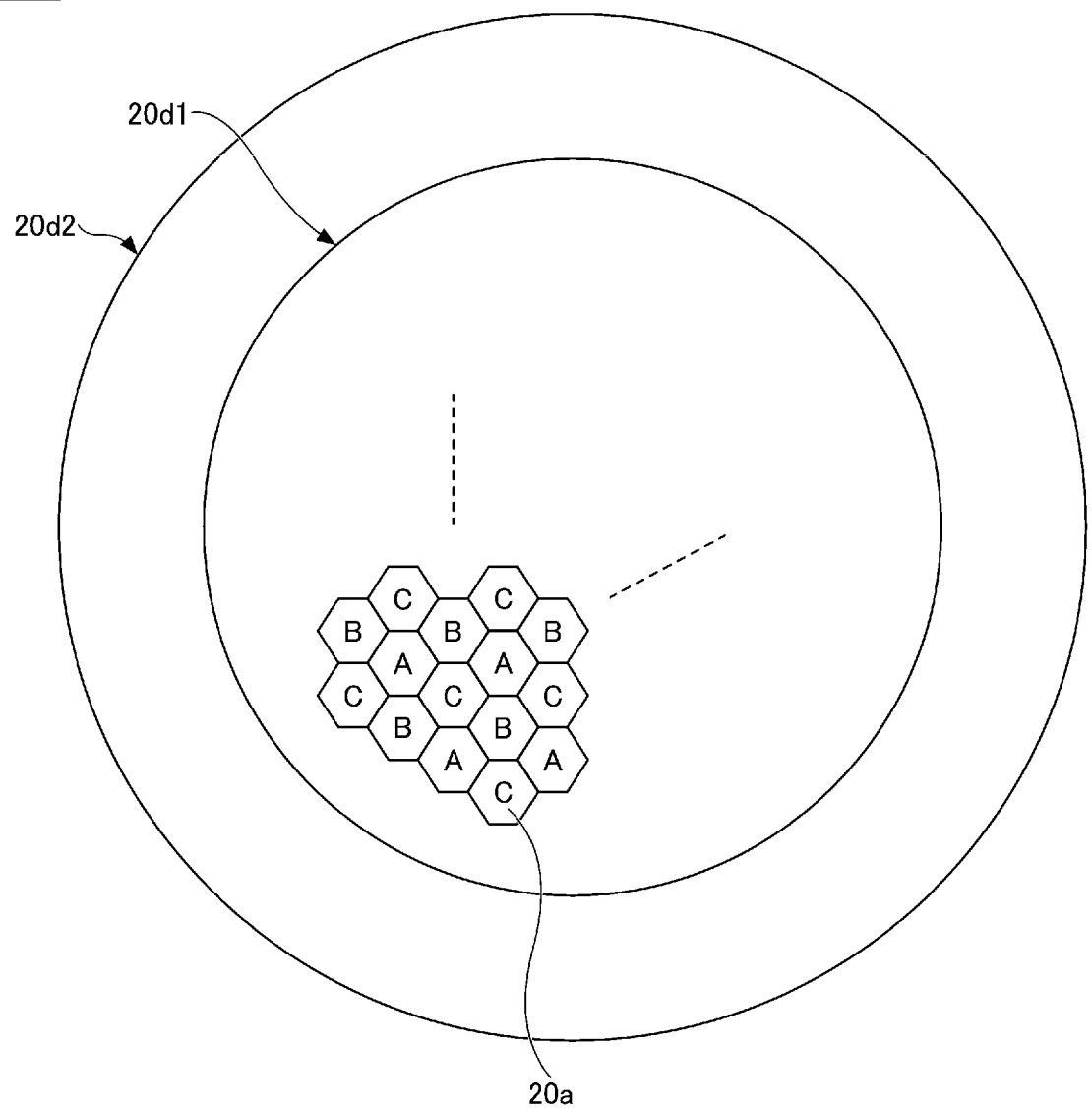
FIG. 10 is a plan view illustrating an example of the arrangement of electrodes of the electrostatic chuck according to another reference example.

However, in the arrangement examples of the electrodes illustrated in FIGS. 9 and 10, an electrode corresponding to one electrode is divided into a plurality of portions, wires between respective electrodes and the power supply 22 branch to a plurality of portions, and connection points between respective electrodes and the power supply 22 also include a plurality of portions.

In contrast to this, in the electrostatic chuck 20 illustrated in FIG. 2, each of the electrodes 20a1 and 20a2 formed in a spiral shape is connected to the power supply 22 at one point. Thereby, manufacturing cost of the electrostatic chuck 20 can be reduced.

Although it is described that the electrodes 20a1 and 20a2 of the first electrode 20a for adsorbing the wafer W are disposed in a spiral shape in the electrostatic chuck 20 as illustrated in FIG. 2, the present disclosure is not limited thereto. The first electrode 20a may be configured to include N electrodes which are two or more electrodes, wherein the N electrodes may be alternately disposed, and a connection between the N electrodes and the power supply 22 each may be made at one point.

As described above, although embodiments and the like of the plasma processing apparatus 1 are described above, the present disclosure is not limited to the above-described embodiments and the like, and various modifications and improvements can be made within the scope of the present disclosure described in the disclosure.

Although it is described that the AC voltages illustrated in FIGS. 7A and 7B are applied using two electrodes, the present disclosure is not limited thereto. Voltages having opposite phases may be applied. Thereby, attractions by the Johnson-Rahbek force can be made.

According to one aspect, a stage and a substrate processing apparatus that are capable of preventing irregularity of an attraction force and reducing costs are provided.

What is claimed is:

1. A stage comprising:
   a base;
   an electrostatic chuck provided on the base and including N electrodes in the electrostatic chuck, where N is an integer greater than or equal to two; and
   a power supply configured to apply voltages of different N-phases to the respective N electrodes, each of the voltages having a positive level and a negative level that periodically alternate,
   wherein a center line of an electrode gap that is provided between adjacent electrodes, among the N electrodes, is configured to satisfy the relation of $x=x=r\cdot\cos(\theta+2\pi(n-1)/N)$ and $y=r\cdot\sin(\theta+2\pi(n-1)/N)$, and wherein
   x and y are coordinates of the center line,
   $\theta$ is a rotation angle of a polar coordinate system in which the center of the electrostatic chuck is an original point, and
   n is a parameter that specifies a range of values of 1 to N.

2. The stage according to claim 1, wherein the power supply is configured to apply an alternating current voltage.

3. The stage according to claim 1, wherein the power supply is configured to apply any one of a rectangular voltage, a triangular voltage, and a sawtooth voltage.

4. The stage according to claim 1, wherein an area ratio between electrodes in the N electrodes is 1.

5. The stage according to claim 1, wherein a phase difference between two voltages of voltages of the N-phases is given by 1/N×360°.

6. The stage according to claim 1, wherein the N electrodes includes six or more electrodes.

7. The stage according to claim 1, wherein the electrostatic chuck is configured to attract a substrate.

8. The stage according to claim 1, wherein the electrostatic chuck is configured to attract an annular member that is disposed along an outer periphery of a substrate.

9. A substrate processing apparatus comprising:
   the stage according to claim 1.

* * * * *